United States Patent [19]

Fan

[11] Patent Number: 5,262,275
[45] Date of Patent: Nov. 16, 1993

[54] FLEXOGRAPHIC PRINTING ELEMENT HAVING AN IR ABLATABLE LAYER AND PROCESS FOR MAKING A FLEXOGRAPHIC PRINTING PLATE

[75] Inventor: Roxy N. Fan, East Brunswick, N.J.

[73] Assignee: E. I. du Pont de Nemours and Company, Wilmington, Del.

[21] Appl. No.: 927,084

[22] Filed: Aug. 7, 1992

[51] Int. Cl.⁵ ................................................. G03C 1/76
[52] U.S. Cl. ................................... 430/273; 430/306; 430/944; 430/945; 430/271
[58] Field of Search ............... 430/273, 944, 945, 271, 430/306; 101/471

[56] References Cited

U.S. PATENT DOCUMENTS 4,020,762  5/1977  Peterson ............................ 101/467
4,093,684  6/1978  Parts et al. ........................ 430/270 X
4,132,168  1/1979  Peterson ............................ 101/471
4,555,471  11/1985  Barzynski et al. ................. 430/273

FOREIGN PATENT DOCUMENTS 1529590  10/1976  United Kingdom .

OTHER PUBLICATIONS

B. F. Griffing, "An Operational Two Level photoresist Technology", *Conference: International Electron Devices Meeting*. Washington, D.C. (Dec. 7-9, 1981) pp. 562-565, IEEE.

*Primary Examiner*—Christopher D. RoDee

[57] ABSTRACT

A photosensitive printing element having an IR ablatable layer and at least one barrier layer as set forth within and a process for making a flexographic printing plate from such an element are disclosed.

3 Claims, No Drawings

FLEXOGRAPHIC PRINTING ELEMENT HAVING AN IR ABLATABLE LAYER AND PROCESS FOR MAKING A FLEXOGRAPHIC PRINTING PLATE

FIELD OF THE INVENTION

This invention relates to a photosensitive printing element and, more particularly, to a flexographic element having an infrared ablatable layer capable of being selectively removed by a laser beam. This invention also relates to a process for making a flexographic printing plate from such an element.

BACKGROUND OF THE INVENTION

Flexographic printing plates are well known for use in letterpress printing, particularly on surfaces which are soft and easily deformable, such as packaging materials, e.g., cardboard, plastic films, etc. Flexographic printing plates can be prepared from photopolymerizable compositions, such as those described in U.S. Pat. Nos. 4,323,637 and 4,427,749. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, polymerization, and hence, insolubilization of the photopolymerizable layer occurs in the exposed areas. Treatment with a suitable solvent removes the unexposed areas of the photopolymerizable layer leaving a printing relief which can be used for flexographic printing.

Imagewise exposure of a photosensitive element requires the use of a phototool which is a mask having clear and opaque areas covering the photopolymerizable layer. The phototool prevents exposure and polymerization in the opaque areas. The phototool allows exposure to radiation in the clear areas so that these areas polymerize and remain on the support after the development step. The phototool is usually a photographic negative of the desired printing image. If corrections are needed in the final image a new negative must be made. This is a time-consuming process. In addition, the phototool may change slightly in dimension due to changes in temperature and humidity. Thus, the same phototool, when used at different times or in different environments, may give different results and could cause registration problems.

Thus, it would be desirable to eliminate the phototool by directly recording information on a photosensitive element, e.g., by means of a laser beam. The image to be developed could be translated into digital information and the digital information used to place the laser for imaging. The digital information could even be transmitted from a distant location. Corrections could be made easily and quickly by adjusting the digitized image. In addition, the digitized image could be either positive or negative, eliminating the need to have both positive-working and negative-working photosensitive materials, or positive and negative phototools. This saves storage space and, thus, reduces cost. Another advantage is that registration can be precisely controlled by machine during the imaging step. Digitized imaging without a phototool is particularly well-suited for making seamless, continuous printing forms.

In general, it has not been very practical to use lasers to image the elements which are used to prepare flexographic printing plates. The elements have low photosensitivity and require long exposure times even with high powered lasers. In addition, most of the photopolymerizable materials used in these elements have their greatest sensitivity in the ultraviolet range. While UV lasers are known, economical and reliable UV lasers with high power are generally not available. However, non-UV lasers are available which are relatively inexpensive, and which have a useful power output and which can be utilized to form a mask image on top of flexographic printing elements.

SUMMARY OF THE INVENTION

The present invention relates to a photosensitive printing element used for preparing flexographic printing plates comprising (a) a support, (b) a photopolymerizable layer comprising an elastomeric binder, at least one monomer and an initiator having sensitivity to non-infrared actinic radiation, said layer being soluble, swellable or dispersible in a developer solution prior to exposure to actinic radiation, (c) at least one barrier layer which is soluble, swellable, dispersible or liftable in the developer solution for the photopolymerizable layer prior to exposure to actinic radiation, and (d) at least one layer of infrared radiation sensitive material which is substantially opaque to actinic radiation wherein the infrared-sensitive material is ablatable from the surface of the barrier layer upon exposure to infrared laser radiation.

The invention further relates to a process for making a flexographic printing plate, which comprises:

(1) imagewise ablating layer (d) of the element described above with infrared laser radiation to form a mask;

(2) overall exposing the photosensitive element to actinic radiation through the mask; and (3) treating the product of step (2) with at least one developer solution to remove (i) the infrared-sensitive material which was not removed during step (1), (ii) the areas of the barrier layer which were not exposed to actinic radiation, and (iii) the areas of the photopolymerizable layer (b) which were not exposed to actinic radiation.

DETAILED DESCRIPTION OF THE INVENTION

The element and process of the invention combine the convenience and sensitivity of infrared laser imaging with conventional photopolymerizable compositions to produce flexographic printing plates with known good printing quality quickly, economically, and by digital imaging means.

The photosensitive element of the invention comprises, in order, a support, a photopolymerizable layer, at least one barrier layer, and a layer of infrared radiation sensitive material.

The support can be any flexible material which is conventionally used with photosensitive elements used to prepare flexographic printing plates. Examples of suitable support materials include polymeric films such those formed by addition polymers and linear condensation polymers, transparent foams and fabrics. A preferred support is a polyester film; particularly preferred is polyethylene terephthalate. The support typically has a thickness from 2 to 10 mils (0.0051 to 0.025 cm), with a preferred thickness of 3 to 8 mils (0.0076 to 0.020 cm).

As used herein, the term "photopolymerizable" is intended to encompass systems which are photopolymerizable, photocrosslinkable, or both. The photopolymerizable layer comprises an elastomeric binder, at least one monomer and an initiator, where the initiator has a sensitivity to non-infrared actinic radiation. In most cases, the initiator will be sensitive to visible or ultraviolet radiation. Any photopolymerizable compositions which are suitable for the formation of flexographic printing plates can be used for the present invention. Examples of suitable compositions have been disclosed, for example, in Chen et al., U.S. Pat. No. 4,323,637, Grüetzmacher et al., U.S. Pat. No. 4,427,749 and Feinberg et al., U.S. Pat. No. 4,894,315.

The elastomeric binder can be a single polymer or mixture of polymers which can be soluble, swellable or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al., U.S. Pat. No. 3,794,494; Proskow U.S. Pat. No. 4,177,074; Proskow U.S. Pat. No. 4,431,723; and Worns U.S. Pat. No. 4,517,279. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen U.S. Pat. No. 4,323,636; Heinz et al., U.S. Pat. No. 4,430,417; and Toda et al., U.S. Pat. No. 4,045,231 can be used. It is preferred that the binder be present in at least an amount of 65% by weight of the photosensitive layer.

The term binder, as used herein, encompasses core shell microgels and blends of microgels and preformed macromolecular polymers, such as those disclosed in Fryd et al., U.S. Pat. No. 4,956,252.

The photopolymerizable layer can contain a single monomer or mixture of monomers which must be compatible with the binder to the extent that a clear, non-cloudy photosensitive layer is produced. Monomers that can be used in the photopolymerizable layer are well known in the art. Examples of such monomers can be found in Chen U.S. Pat. No. 4,323,636; Fryd et al., U.S. Pat. No. 4,753,865; Fryd et al., U.S. Pat. No. 4,726,877; and Feinberg et al., U.S. Pate. No. 4,894,315. It is preferred that the monomer be present in at least an amount of 5% by weight of the photopolymerizable layer.

The photoinitiator can be any single compound or combination of compounds which is sensitive to non-infrared actinic radiation, generating free radicals which initiate the polymerization of the monomer or monomers without excessive termination. The photoinitiator is generally sensitive to visible or ultraviolet radiation, preferably ultraviolet radiation. It should be thermally inactive at and below 185° C. Examples of suitable photoinitiators include the substituted and unsubstituted polynuclear quinones. Examples of suitable systems have been disclosed in Grüetzmacher U.S. Pat. No. 4,460,675 and Feinberg et al., U.S Pat. No. 4,894,315. Photoinitiators are generally present in amounts from 0.001% to 10.0% based on the weight of the photopolymerizable composition.

The photopolymerizable layer can contain other additives depending on the final properties desired. Such additives include sensitizers, rheology modifiers, thermal polymerization inhibitors, tackifiers, plasticizers, colorants, antioxidants, antiozonants, or fillers.

The thickness of the photopolymerizable layer can vary over a wide range depending upon the type of printing plate desired. For so called "thin plates" the photopolymerizable layer can be from about 20 to 50 mils (0.05 to 0.13 cm) in thickness. Thicker plates will have a photopolymerizable layer up to 100-250 mils (0.25 to 0.64 cm) in thickness or greater.

At least one barrier layer is interposed between the photopolymerizable layer and the layer of infrared-sensitive material. The barrier layer serves two important functions. First, it minimizes migration of materials between the photopolymerizable layer and the infrared-sensitive layer because monomers and plasticizers can migrate over time if they are compatible with the materials in the other layer. If such migration occurs into the infrared-sensitive layer, then the infrared sensitivity of that layer can be altered. In addition, this can cause smearing and tackifying of the infrared sensitive layer after imaging. If there is no compatibility between the two layers there will be no migration.

Second, the barrier layer shields the photopolymerizable layer from atmospheric oxygen when the photopolymerizable layer is overall exposed to actinic radiation. The polymerization reactions require longer exposure times or higher intensity radiation sources, and the results are less reproducible when oxygen is present. It is possible to apply a temporary coversheet prior to exposure to actinic radiation or to carry out that exposure step in a vacuum frame. However, the photopolymerizable layer is usually inherently tacky and steps must be taken to prevent the temporary coversheet or vacuum frame cover from sticking to and/or damaging the surface of the photopolymerizable layer. The presence of a non-tacky barrier layer which minimizes the permeation of oxygen to the photopolymerizable layer addresses these problems.

The barrier layer must be substantially transparent to actinic radiation so that when the element is exposed to actinic radiation through the infrared-sensitive layer, the radiation passes through the ablated areas of the barrier layer to the photopolymerizable layer without significant diminution in intensity. The barrier layer should also initially (i.e., prior to exposure to actinic radiation) be soluble, swellable or dispersible in the developer solvent for the photopolymerizable layer or it should be liftable in that solvent. By "liftable" it is meant that the solvent is able to lift off the barrier layer at least partially intact. This is so that the barrier layer will be removed by the developer in at least those areas which are not exposed to actinic radiation, i.e., in those areas where the photopolymerizable layer is also removed.

Two types of barrier layers can be used. The first type is one which is insensitive to actinic radiation and is soluble, swellable, dispersible or liftable in developer solutions for the photopolymerizable layer both before and after exposure to actinic radiation. This type of barrier layer is completely removed in both exposed and unexposed areas, along with the unexposed areas of the photopolymerizable layer, during processing with the developer.

Examples of materials which are suitable for use as the barrier layer of this first type include those materials which are conventionally used as a release layer in flexographic printing elements, such as polyamides, polyvinyl alcohol, hydroxyalkyl cellulose, copolymers of ethylene and vinyl acetate, amphoteric interpolymers, and combinations thereof.

The second type of barrier layer is one which is soluble, swellable or dispersible in the developer solvent prior to exposure to actinic radiation, but is not affected by the developer solvent after exposure to actinic radiation. When this type of barrier layer is used it is removed by the developer solvent only in those areas which are not exposed to actinic radiation. The barrier layer which has been exposed to actinic radiation remains on the surface of the polymerized areas of the photopolymerizable layer and becomes the actual printing surface of the printing plate.

This type of barrier layer can be photosensitive itself, i.e., contain monomer and initiator, or it can become photosensitive when in contact with the photopolymerizable layer. This second type of barrier layer is usually a layer of an elastomeric composition. The composition can consist simply of a nonphotosensitive elastomeric binder layer similar to the binder in the photopolymerizable layer or it can be the binder in combination with a monomer and initiator. A preferred barrier layer is an elastomeric composition comprising an elastomeric polymeric binder, a second polymeric binder and optionally a nonmigratory dye or pigment. The elastomeric polymeric binder in the elastomeric composition is generally the same as or similar to the elastomeric binder present in the photopolymer layer. Suitable compositions for the barrier layer are those disclosed as elastomeric compositions in the multilayer cover element described in Gruetzmacher et al., U.S. Pat. Nos. 4,427,759 and 4,460,675.

It is also possible to use more than one barrier layer. For example, an elastomeric barrier layer may be present next to the photopolymerizable layer and this, in turn, may be overcoated with a barrier layer which is soluble both before and after exposure to actinic radiation. The exact choice of barrier layer(s) will depend on the nature of the photopolymerizable layer and the infrared-sensitive layer and other physical requirements of the printing element.

The barrier layer, of either type, should be thick enough to act as an effective barrier to prevent migration and air permeation and also be thin enough to minimize its effect on the exposure of the photopolymerizable layer to actinic radiation. In general, the barrier layer will have a thickness in the range of 0.01 to 3 mils (0.00025 to 0.076 mm). A preferred thickness range is 0.015 to 2.5 mils (0.00038 to 0.064 mm).

Over the barrier layer, there is at least one layer of infrared radiation sensitive material which must be ablatable, i.e., vaporized or ablated, by exposure to infrared laser radiation.

The infrared-sensitive layer should be capable of absorbing infrared radiation and should be opaque to actinic radiation. This can be accomplished using a single material or a combination of materials. Also, a binder can be present if desired. This layer may be referred to as the "infrared-sensitive layer" or the "actinic radiation opaque layer" (radiation opaque layer). Although the infrared-sensitive layer is referred to herein as a single layer, it will be understood that two or more infrared-sensitive layers can be used. The properties of the infrared-sensitive layer can be modified by using other ingredients, such as, for example, plasticizers, pigment dispersants, surfactants, and coating aids, provided that they do not adversely affect the imaging properties of the element.

The infrared-absorbing material should have a strong absorption in the region of the imaging radiation, typically 750 to 20,000 nm. Examples of suitable infrared-absorbing materials include, poly(substituted)phthalocyanine compounds; cyanine dyes; squarylium dyes; chalcogenopyryloarylidene dyes; bis(chalcogenopyrylo)polymethine dyes; oxyindolizine dyes; bis(aminoaryl)polymethine dyes; merocyanine dyes; croconium dyes; metal thiolate dyes; and quinoid dyes. Also suitable are dark inorganic pigments such as carbon black, graphite, copper chromite, chromium oxides and cobalt chrome aluminate; metals such as aluminum, copper or zinc; and alloys of bismuth, indium and copper. The metallic materials generally function as both infrared-absorbing material and radiation-opaque material. They are generally applied without a binder.

Infrared-absorbing materials can be present in any concentration which is effective for the intended purpose. In general, for the organic compounds, concentrations of 0.1 to 40% by weight, based on the total weight of the layer, have been found to be effective.

Any material which prevents the transmission of actinic light to the photopolymerizable layer can be used as the radiation-opaque material. Examples of suitable materials include dyes and pigments. As initiators used in the photopolymerizable layer are often sensitive to actinic radiation in the ultraviolet and/or visible region, it is preferred to use carbon black to provide UV/visible opacity. When carbon black is used it is not necessary to use an additional infrared-sensitive material.

The concentration of the radiation-opaque material is chosen so as to achieve the desired optical density, i.e., so that the layer prevents the transmission of actinic radiation to the photopolymerizable layer. In general, a transmission optical density greater than 2.0 is preferred. The concentration of radiation-opaque material which is needed, decreases with increasing thickness of the layer. In general a concentration of 1-70% by weight, based on the total weight of the layer can be used. It is preferred to use 2-40% by weight, based on the total weight of the layer.

The optional binder is a polymeric material which should satisfy several requirements: (1) The binder should be effectively removed by the heat generated by the infrared-absorbing material when the layer is exposed to infrared laser radiation. (2) The binder should be removable from the surface of the photopolymerizable layer after the infrared imaging step. This condition is met if the binder is soluble, swellable or dispersible in the developer solvent for the photopolymerizable layer. The binder may also be removed in a separate step, e.g., the binder can be soluble, swellable or dispersible in a second solvent which does not affect the polymerized areas of the photopolymerizable layer. (3) The binder should be one in which the other materials in the infrared-sensitive layer can be uniformly dispersed. (4) The binder should be capable of forming a uniform coating on the barrier layer. Examples of organic binders which can be used include self-oxidizing polymers such as nitrocellulose; non-self-oxidizing polymers such as ethylcellulose, polyacrylic acids and the metal alkali salts thereof; thermochemically decomposable polymers such as homopolymers and copolymers of acrylates, methacrylates, and styrene; butadiene, isoprene, and their copolymers (i.e., polymers of two or more monomers) and block copolymers with styrene and/or olefins, pyrolyzable films such as polyvinyl alcohol, polyvinyl chloride, and polyacrylonitrile; amphoteric interpolymers; and mixtures thereof.

A dispersant is generally added when a pigment is present in the infrared-sensitive layer in order to disperse the fine particles and avoid flocculation and agglomeration. A wide range of dispersants is commercially available. Suitable dispersants are the A-B dispersants generally described in "Use of A-B Block polymers as Dispersants for Non-aqueous Coating Systems" by H. K. Jakubauskas, Journal of Coating Technology, Vol. 58; Number 736; pages 71-82. Useful A-B dispersants are disclosed in U.S. Pat. Nos. 3,684,771; 3,788,996; 4,070,388 and 4,032,698. The dispersant is generally present in an amount of about 0.1 to 10% by weight, based on the total weight of the layer.

A plasticizer can be added to adjust the film forming properties of the binder. Suitable plasticizers include, for example, triphenyl phosphite, dimethyl phthalate, diethyl phthalate, dicyclohexyl phthalate, cyclohexyl benzyl phthalate, dibutoxy ethyl adipate, ethyleneglycol dibenzoate, pentaerythritol tetrabenzoate, glycerol diacetate, glyceryl carbonate, polyethylene glycol monolaurate, methyl phthalyl ethyl glycolate, o,p-toluenesulfonamide, N-ethyl-p-toluenesulfonamide, and N-cyclohexyl-o,p-toluenesulfonamide. The plasticizer should be present in an amount effective for the intended purpose which depends on the properties of the binder, the plasticizer, and the other components of the layer. In general, the amount of plasticizer, when present, is 1-30% by weight, based on the weight of the layer.

The thickness of the infrared-sensitive layer should be in a range to optimize both sensitivity and opacity. The layer should be thin enough to provide good sensitivity, i.e., the infrared-sensitive layer should be removed rapidly upon exposure to infrared laser radiation. At the same time, the layer should be thick enough so that the areas of the layer which remain on the photopolymerizable layer after imagewise exposure effectively mask the photopolymerizable layer from actinic radiation. In general, this layer will have a thickness from about 20 Angstroms to about 50 micrometers. It is preferred that the thickness be from 40 Angstroms to 40 micrometers.

The photosensitive element of the invention can also include a temporary coversheet on top of the infrared-sensitive layer. The purpose of the coversheet is to protect the infrared-sensitive layer during storage and handling. It is important that the coversheet be removed prior to exposing the infrared-sensitive layer to infrared laser radiation. Examples of suitable materials for the coversheet include thin films of polystyrene, polyethylene, polypropylene, polycarbonate, fluoropolymers, polyamide or polyester, which can be subbed with release layers.

The photosensitive element of the invention is generally prepared by first preparing the photopolymerizable layer on the support and then applying the barrier and infrared-sensitive layers by coating or lamination techniques.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered between the support and a temporary coversheet or a temporary coversheet which has been previously coated with the barrier layer. In the latter case it is arranged so that the barrier layer is next to the photopolymerizable layer during the calendering process. The adhesion between the barrier layer and the temporary coversheet should be low, so that the barrier layer will remain intact on the photopolymerizable layer when the temporary coversheet is removed. Alternatively, the photopolymerizable material can be placed between the support and the temporary coversheet or the barrier layer coated temporary coversheet in a mold. The layers of material are then pressed flat by the application of heat and/or pressure.

The infrared-sensitive layer is generally prepared by coating the infrared-sensitive material onto a second temporary coversheet. The infrared-sensitive layer can be applied using any known coating technique including spray coating. It also can be applied by vapor deposition under vacuum or by sputtering. The last methods are particularly useful for metal layers.

The adhesion of this second temporary coversheet should also be low so that the sheet is easily removed. The infrared-sensitive layer can then be overcoated with the barrier layer or the two layers can be coated simultaneously.

The final element is prepared by (1) removing the temporary coversheet from the photopolymerizable layer and placing it together with the second element (second temporary coversheet/infrared-sensitive layer/barrier layer) such that the barrier layer is adjacent to the photopolymerizable layer; or (2) removing the temporary coversheet from the barrier layer on the photopolymerizable layer and placing it together with the second element (second temporary coversheet/infrared-sensitive layer) such the infrared-sensitive layer is adjacent to the barrier layer. This composite element is then pressed together with moderate pressure. The second temporary coversheet can remain in place for storage, but must be removed prior to IR laser imaging.

Alternatively, the three layers can all be prepared on temporary coversheets: the photopolymerizable layer by extrusion and calendering or pressing in a mold; the barrier and infrared-sensitive layers by coating. The final element is prepared by removing the temporary coversheet from the photopolymerizable element, applying the barrier layer such that the barrier layer is adjacent to the photopolymerizable layer, removing the temporary coversheet from the barrier layer, and applying the infrared-sensitive layer such that the infrared-sensitive layer is adjacent to the barrier layer. The composite structure is laminated together as each new layer is added or one time for all the layers. The temporary coversheet on the infrared-sensitive layer can remain in place for storage, but must be removed prior to imaging.

The infrared-sensitive layer can also be coated directly onto the barrier layer which is on the photopolymerizable layer.

The process of the invention involves (1) imagewise ablating layer (d) of the element described above to form a mask; (2) overall exposing the photosensitive element to actinic radiation through the mask; and (3) treating the product of step (2) with at least one developer solution treating the product of step (2) with at least one developer solution to remove (i) the infrared-sensitive material which was not removed during step (1), (ii) the areas of the barrier layer which were not exposed to actinic radiation, and (iii) the areas of the photopolymerizable layer (b) which were not exposed to actinic radiation.

The first step in the process of the invention is to imagewise ablate layer (d) to form a mask. This exposure is given to the side of the photosensitive element bearing the infrared-sensitive layer. If a temporary coversheet is present in the element, it should be removed prior to the exposure step. The exposure can be carried out using various types of infrared lasers. Diode lasers emitting in the region of 750 to 880 nm offer substantial advantages in terms of their small size, low cost, stability, reliability, ruggedness and ease of modulation. Diode lasers emitting in the range of 780 to 850 nm may be used to advantage. Such lasers are commercially available from, for example, Spectra Diode Laboratories (San Jose, Calif.). YAG lasers emitting at 1060 nm are also very effective.

In the infrared imagewise ablating step, material in the infrared-sensitive layer is removed, i.e., ablated, in the areas exposed to the infrared laser radiation. The areas exposed to laser radiation in the infrared-sensitive layer correspond to those areas in the photopolymerizable layer which will be polymerized to form the final printing plate. After laser ablation, a pattern of actinic radiation-opaque material remains on the barrier layer over the photopolymerizable layer. The areas in which the infrared-sensitive layer remains correspond to the areas of the photopolymerizable layer which will be washed out in the formation of the final printing plate.

The next step in the process of the invention is to overall expose the photosensitive element to actinic radiation through the mask. The type of radiation used is dependent on the type of photoinitiator in the photopolymerizable layer. The radiation-opaque material in the infrared sensitive layer which remains on top of the barrier layer on the photopolymerizable layer prevents the material beneath from being exposed to the radiation and hence those areas covered by the radiation-opaque material do not polymerize. The areas not covered by the radiation-opaque material are exposed to actinic radiation and polymerize. Any conventional sources of actinic radiation can be used for this exposure step. Examples of suitable visible or UV sources include carbon arcs, mercury-vapor arcs, fluorescent lamps, electron flash units, electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350 VL/VHO/180, 115 w) which has a central wavelength of emission around 354 nm.

It is contemplated that the imagewise exposure to infrared radiation and the overall exposure to actinic radiation can be carried out in the same equipment. It is preferred that this be done using a drum—i.e., the photosensitive element is mounted on a drum which is rotated to allow for exposure of different areas of the element.

The actinic radiation exposure time can vary from a few seconds to minutes, depending upon the intensity and spectral energy distribution of the radiation, its distance from the photosensitive element, and the nature and amount of the photopolymerizable composition. Typically a mercury vapor arc or a sunlamp is used at a distance of about 1.5 to about 60 inches (3.8 to 153 cm) from the photosensitive element. Exposure temperatures are preferably ambient or slightly higher, i.e., about 20° to about 35° C.

The process of the invention usually includes a back exposure or backflash step. This is a blanket exposure to actinic radiation through the support. It is used to create a shallow layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. It is preferred that it take place just prior to the imagewise exposure to infrared laser radiation on the infrared-sensitive layer side of the element.

Any of the conventional radiation sources discussed above can be used for the backflash exposure step. Exposure time generally range from a few seconds up to about a minute.

Following overall exposure to UV radiation through the mask formed by the actinic radiation-opaque material, the image is developed by washing with a suitable developer. Development is usually carried out at about room temperature. The developers can be organic solvents, aqueous or semi-aqueous solutions. The choice of the developer will depend on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. However, washout is frequently carried out in an automatic processing unit which uses developer and mechanical brushing action to removed the unexposed portions of the plate, leaving a relief constituting the exposed image and the floor.

A pre-development step may be necessary if the infrared-sensitive layer is not removable by the developer solvent. An additional developer, which does not effect the polymerized photosensitive material can be applied to remove the infrared-sensitive layer first. This is particularly true when metallic materials are used. In such cases, etching solvents are used, such as 2% aqueous KOH solution.

Following solvent development, the relief printing plates are generally blotted or wiped dry, and then dried in a forced air or infrared oven. Drying times and temperatures may vary, however, typically the plate is dried for 60 to 120 minutes at 60° C. High temperatures are not recommended because the support can shrink and this can cause registration problems.

Most flexographic printing plates are uniformly post-exposed to ensure that the photopolymerization process is complete and that the plate will remain stable during printing and storage. This post-exposure step utilizes the same radiation source as the main exposure.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, Gruetzmacher U.S. Pat. No. 4,400,459, Fickes et al., U.S. Pat. No. 4,400,460 and German Patent 28 23 300. Detackification can also be accomplished by exposure to radiation sources having a wavelength not longer than 300 nm, as disclosed in European Published Patent Application 0 017927 and Gibson U.S. Pat. No. 4,806,506.

These elements can be used to particular advantage in the formation of seamless, continuous printing elements. The photopolymerizable flat sheet elements can be reprocessed by wrapping the element around a cylindrical form, usually a printing sleeve or the printing cylinder itself, and fusing the edges together to form a seamless, continuous element. In a preferred method, the photopolymerizable layer is wrapped around the cylindrical form and the edges joined. One process for joining the edges has been disclosed in German patent DE 28 44 426. The photopolymerizable layer can then be spray coated with, at least one barrier layer and then with at least one infrared-sensitive layer.

Continuous printing elements have applications in the flexographic printing of continuous designs such as in wallpaper, decoration and gift wrapping paper. Furthermore, such continuous printing elements are well-suited for mounting on conventional laser equipment. The sleeve or cylinder on which the printing element is wrapped when the edges are fused, can be mounted directly into the laser apparatus where it functions as the rotating drum during the laser exposure step.

Unless otherwise indicated, the term "flexographic printing plate or element" encompasses plates or elements in any form suitable for flexographic printing, including, but not limited to, flat sheets and seamless continuous forms. All publications/references mentioned herein are hereby incorporated by reference unless otherwise indicated.

EXAMPLES

Example 1

This examples illustrates the preparation of a photosensitive element having a layer which is sensitive to infrared radiation and two types of barrier layers.

An infrared sensitive layer was obtained by using an infrared-sensitive UV opaque film having a support (LaserMask TM, made by James River Graphics, Inc., South Hadley, Mass.). A photopolymerizable layer was obtained by using a Cyrel® 107 PLS+ printing element (E. I. du Pont de Nemours and Company, Wilmington, Del.). In the printing element, the photopolymerizable layer is overcoated with an elastomeric layer, which functions as one barrier layer, and which is further overcoated with a polyamide release layer, which functions as a second barrier layer.

A sheet of the infrared-sensitive UV opaque film was sprayed with a mixture of methanol and ethanol (2:1 w/w) to soften the coating. The Cyrel® 107 PLS+ coversheet was removed and the softened coating side of the infrared-sensitive film was placed on top of the release layer. This was laminated at room temperature to squeeze out the excess solvent. The IR support was then removed from the infrared-sensitive layer and the element was air dried. The density of the infrared-sensitive layer on the element was increased by laminating additional infrared-sensitive films, with the coating softened, onto the element four more times.

Example 2

This example illustrates the use of a Nd:YAG laser for the imaging step in the process of the invention.

The laser used was a Quanta DCR-11 model (Spectra Physics Corp., Mountain View, CA) at a wavelength of 1064 nm. The laser was Q-switched with a 20 ns pulse.

A photosensitive element prepared as described in Example 1 was given 50, 100, 250 and 500 mj exposures in a shadow dot pattern with the above laser, using one pulse per shadow dot. Holes were ablated in the infrared-sensitive layer resulting in a pattern of rows of shadow dots with a distance of 250 micrometers between the dots.

After imagewise laser ablating the infrared sensitive layer, the element was given a backflash exposure for 50 seconds on a Cyrel® 3040 light source (E. I. du Pont de Nemours and Company, Wilmington, Del.), and then given a top exposure, i.e., through the imaged infrared-sensitive coating, for 10 minutes using the same light source without a vacuum. The exposed element was developed in a Cyrel® rotary processor for 5.5 minutes using 3:1 mixture (vol/vol) of Perclene and butanol. The black mask and the polyamide barrier layer were removed in the developer. The photopolymerizable layer and the elastomeric barrier layer were removed in the unexposed areas only. The plate was oven dried for two hours at 60° C. and then simultaneously post exposed and light finished in a Cyrel® light finishing unit for 10 minutes. Highlight dots were obtained for all exposures except the 50 mj exposure.

Example 3

This example illustrates the process of the invention using a diode laser for the imagewise laser ablating step.

A photosensitive element prepared as described in Example 1 was imaged using a Crosfield 645 scanner modified with an IR diode laser head having 780 to 840 nm output as described in Kellogg et al., *Journal of Imaging Science and Technology*, Vol. 36, No. 3, pages 220–224 (May/June 1992), the disclosure of which is hereby incorporated by reference. The mounted assembly was given an imagewise exposure using signals sent from the Crosfield 645 reader. A halftone image was used (150 lines per inch screen) and the exposure energy was 1200 mj/cm$^2$. The black, UV-opaque material was removed in the areas which had been exposed to the laser.

After imagewise laser ablating the infrared sensitive layer, the element was exposed and developed as described in Example 2. An image was obtained.

Example 4

This example illustrates the preparation of a different infrared sensitive layer which is used with a single barrier layer which is completely removed in the developer solvent.

S-B-S, a styrene-butadiene-styrene block copolymer (Kraton® 1102, Shell Chemical Co., Houston, Tex.) was precompounded with carbon black to a level of 10 phr in a Moriyama batch mixer. An infrared sensitive composition was prepared by dispersing and dissolving the following components in methylene chloride as a 15% solution:

| Component | Amount (g) |
|---|---|
| S-B-S, 10 phr carbon | 33.0 |
| MABS[a] | 16.5 |
| BHT[b] | 0.5 |
| Final % C | 6.06 |

[a]MABS = tetrapolymer of methylmethacrylate/acrylonitrile/butadiene/styrene; Blendex ® 491 from General Electric Co., Parkersburg, WV
[b]BHT = butyrated hydroxy toluene The coversheet was removed from a Cyrel® 112 HO printing element (E. I. du Pont de Nemours and Company, Wilmington, Del.), and the infrared sensitive composition was coated onto the release layer of the Cyrel® plate, which functioned as the barrier layer, using a 10 mil (0.025 cm) doctor knife to form a 1 mil (0.0025 cm) dry coating. The UV density of the resulting plate was 3.61.

The element was then laser ablated as described in Example 2 except that exposures of 100, 200, 300, 400 and 500 μj and 1 and 2 mj were used.

After imagewise laser ablating the infrared sensitive layer, the element was exposed and developed as described in Example 2. In the development step, the black and the barrier layer are completely removed along with the unexposed areas of the photopolymerizable layer. An image with good relief highlight dots was obtained with all exposures levels except 100 and 200 μj.

Example 5

This example illustrates the use of a spray-coated infrared sensitive layer. This process is particularly useful in the formation of continuous printing elements.

An infrared sensitive composition was prepared by dispersing and dissolving the components given in Example 4 in toluene to form a 15% solution. Using a Jet Pak Power Unit (Spray-on Products, Inc., Cleveland, Ohio), the infrared sensitive composition was sprayed onto a Cyrel® 112 HO printing element from which the coversheet had been removed leaving the release layer as the barrier layer. The coating was accomplished in 4 passes. The toluene solvent did not attack the barrier or photopolymerizable layers and a good element was obtained.

Example 6

An infrared-sensitive composition was prepared from the following:

| Component | Amount (g) |
|---|---|
| Methylene chloride | 283 |
| S-B-S, 50 phr carbon | 33 |
| MABS | 16.5 |
| BHT | 0.5 |
| Surfactant[a] | 0.2 ml |

[a]FC-430 made by 3M Company (St. Paul, MN)

Using a 4 mil (0.010 cm) doctor knife, the infrared sensitive solution was coated onto a 1 mil (0.0025 cm) sheet of silicone-release treated Mylar® polyester. The dry coating weight was 115.2 g/dm² and the resulting optical density was 4.79. After the infrared sensitive coating was dry, it was overcoated with a barrier layer coating of 85% polyamide (Macromelt® 6900 from Henkel Corp., Minneapolis, Minn.) and 15% amphoteric interpolymer (40% N-t-octylacrylamide, 34% methyl methacrylate, 16% acrylic acid, 6% hydroxypropyl methacrylate, and 4% t-butyl amino ethylmethacrylate), as a 10% propanol solution, using a 4 mil (0.010 cm) doctor knife.

The coversheet and release layer were removed from a Cyrel® 30 CP printing element (E. I. du Pont de Nemours and Company, Wilmington, Del.), leaving the photopolymer layer as the top layer. The infrared sensitive composite was then laminated to the printing element such that the barrier layer was adjacent to the photopolymer layer.

The silicone-release Mylar® coversheet was removed and the infrared sensitive layer of the element was imagewise ablated using a commercial laser engraving apparatus equipped with a Nd:YAG laser. The element was mounted on the exterior of a rotating drum. The laser beam was directed parallel to the axis of the drum, and was directed toward the sample surface with a folding mirror. The folding mirror was stationary and the drum moved parallel to its axis. The laser beam was then focused to impinge on the sample mounted on the drum. As the drum rotated and translated relative to the laser beam, the sample was exposed in a spiral fashion. The laser beam was modulated with image data, i.e., dots, lines and text characters. The laser was operated at 2 watts and the drum was rotated at 104 rpm with a 25 micrometer advance rate. This resulted in a UV-opaque patterned mask on the surface of the photopolymer element with a tonal range of 2-98% and isolated fine lines, and dots resolved using a 60 lines per inch screen.

After imagewise laser ablating the infrared sensitive layer, the element was given a backflash exposure for 12 seconds on a Cyrel® 3040 light source, and then given a top exposure, i.e., through the imaged infrared-sensitive coating, for 7 minutes using the same light source without a vacuum. The exposed element was developed in a Cyrel® rotary processor for 3 minutes using 3:1 mixture (vol/vol) of Perclene and butanol. The black mask, the barrier layer and the unexposed areas of the photosensitive layer were removed. The plate was oven dried for one hour at 60° C and then simultaneously post exposed and light finished in a Cyrel® light finishing unit for 5 minutes.

Printing tests were carried out with the developed plate on a Mark Andy press System 830 (Chesterfield, MO) using Film III Dense Black EC8630 ink (Environmental Inks & Coatings, Morganton, NC) diluted with EIC Aqua Refresh EC1296 to a viscosity of 20 seconds as measured using a Zahn #2 cup. Printing was done on Hi Gloss 40FS S246 paper (Fasson, Painesville, OH). All samples were run at optimum impression as judged by the operator at 150 feet per minute. Good printed images were obtained.

Example 7

This example illustrates the preparation of a very thin infrared-sensitive coating which can be used with the Cyrel® printing elements in the above examples.

S-B-S was precompounded with carbon black to a level of 50 phr in a Moriyama batch mixer. An infrared sensitive composition was prepared by dispersing and dissolving the following components in methylene chloride as a 15% solution:

| Component | Amount (g) |
| --- | --- |
| S-B-S, 50 phr carbon | 49.5 |
| BHT | 0.5 |

Using a 1 mil (0.0025 cm) doctor knife, the infrared sensitive solution was coated onto a 1 mil (0 0025 cm) sheet of silicone-release treated Mylar ® polyester. The dry coating weight was 33.7 g/dm² and the resulting optical density was 2.45.

Example 8

The procedure of Example 6 was repeated substituting a Cyrel ® 67 HO printing element (E. I. du Pont de Nemours and Company, Wilmington, DE) for the Cyrel ® 30CP printing element. The composite element was exposed and developed as described in Example 6 except that the backflash exposure was 15 seconds, the top exposure was 9 minutes and the development time was 6 minutes.

Using the printing conditions of Example 6, a good print image was obtained.

What is claimed is:

1. A photosensitive printing element used for preparing flexographic printing plates comprising in the order listed:
   (a) a support,
   (b) a photopolymerizable layer comprising an elastomeric binder, at least one monomer and an initiator having sensitivity to non-infrared actinic radiation, said layer being soluble, swellable or dispersible in a developer solution;
   (c) at least one barrier layer which is soluble, swellable or dispersible or liftable in the developer solution for the photopolymerizable layer and which is substantially transparent to actinic radiation; and
   (d) at least one layer of infrared radiation sensitive material which is substantially opaque to actinic radiation,
   wherein the infrared-sensitive material is ablatable form the surface of the barrier layer upon exposure to infrared laser radiation.

2. An element according to claim 1 which further comprises
   (e) a strippable coversheet which is adjacent to layer (d).

3. An element according to claims 1 or 2 wherein carbon black is present in the infrared radiation sensitive layer (d).

* * * * *

(12) EX PARTE REEXAMINATION CERTIFICATE (5232nd)
United States Patent
Fan

(10) Number: US 5,262,275 C1
(45) Certificate Issued: Nov. 22, 2005

(54) FLEXOGRAPHIC PRINTING ELEMENT HAVING AN IR ABLATABLE LAYER AND PROCESS FOR MAKING A FLEXOGRAPHIC PRINTING PLATE

(75) Inventor: Roxy N. Fan, East Brunswick, NJ (US)

(73) Assignee: E. I. du Pont de Nemours and Company, Wilmington, DE (US)

Reexamination Request:
No. 90/006,741, Aug. 12, 2003

Reexamination Certificate for:
Patent No.: 5,262,275
Issued: Nov. 16, 1993
Appl. No.: 07/927,084
Filed: Aug. 7, 1992

(51) Int. Cl.⁷ .............................. G03F 7/09; G03C 1/76
(52) U.S. Cl. .............................. 430/273.1; 430/271.1; 430/306; 430/944; 430/945
(58) Field of Search .......................... 430/271.1, 273.1, 430/306, 944, 945; 101/453, 465

(56) References Cited

U.S. PATENT DOCUMENTS

| | | |
|---|---|---|
| 3,218,167 A | 11/1965 | Burg et al. |
| 3,458,311 A | 7/1969 | Alles |
| 4,132,168 A | 1/1979 | Peterson |
| 4,245,003 A | 1/1981 | Oransky et al. |
| 4,320,189 A | 3/1982 | Taguchi et al. |
| 4,427,759 A | 1/1984 | Gruetzmacher et al. |
| 4,624,891 A | 11/1986 | Sato et al. |
| 5,015,553 A | 5/1991 | Grandmont et al. |
| 5,049,476 A | 9/1991 | Platzer |
| 5,164,277 A | 11/1992 | Hirai et al. |
| 5,192,641 A | 3/1993 | Shaw et al. |
| 5,607,814 A | 3/1997 | Fan et al. |

FOREIGN PATENT DOCUMENTS

JP 1-118842 5/1989

*Primary Examiner*—Barbara L. Gilliam

(57) ABSTRACT

A photosensitive printing element having an IR ablatable layer and at least one barrier layer as set forth within and a process for making a flexographic printing plate from such an element are disclosed.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2 and 3, dependent on an amended claim, are determined to be patentable.

1. A photosensitive printing element used for preparing flexographic printing plates comprising in the order listed:
   (a) a support,
   (b) a photopolymerizable layer comprising an elastomeric binder, at least one monomer and an initiator having sensitivity to non-infrared actinic radiation, said layer being soluble, swellable or dispersible in a developer solution;
   (c) at least one barrier layer which is soluble, swellable or dispersible or liftable in the developer solution for the photopolymerizable layer and which is substantially transparent to actinic radiation; and
   (d) at least one layer of infrared radiation sensitive material which is substantially opaque to actinic radiation,
   wherein the infrared-sensitive material is ablatable [form] *from* the surface of the barrier layer upon exposure to infrared laser radiation.

* * * * *